United States Patent
Jin (10) Patent No.: US 9,123,915 B2
(45) Date of Patent: Sep. 1, 2015

(54) TRAY FOR DONOR FILM

(71) Applicant: Samsung Display Co., Ltd., Yongin, Gyeonggi-Do (KR)

(72) Inventor: Yong-Hyun Jin, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 293 days.

(21) Appl. No.: 13/651,963

(22) Filed: Oct. 15, 2012

(65) Prior Publication Data

US 2013/0241126 A1  Sep. 19, 2013

(30) Foreign Application Priority Data

Mar. 14, 2012  (KR) .......................... 10-2012-0026135

(51) Int. Cl.
*B25B 11/00* (2006.01)
*H01L 51/56* (2006.01)
*B41F 16/00* (2006.01)

(52) U.S. Cl.
CPC .............. *H01L 51/56* (2013.01); *B41F 16/006* (2013.01)

(58) Field of Classification Search
USPC ....................... 269/8; 335/285, 306; 279/128; 254/134.3 R, 134.3 FT, 134.4
See application file for complete search history.

(56) References Cited

U.S. PATENT DOCUMENTS

| | | | |
|---|---|---|---|
| 7,834,451 | B2 | 11/2010 | Lee et al. |
| 2007/0045540 | A1 | 3/2007 | Kang et al. |
| 2007/0046072 | A1 | 3/2007 | Kang et al. |
| 2007/0046762 | A1 | 3/2007 | Kang et al. |
| 2007/0048658 | A1 | 3/2007 | Kang et al. |
| 2007/0063205 | A1 | 3/2007 | Kang et al. |
| 2008/0148558 | A1* | 6/2008 | Oh .................................. 29/743 |
| 2009/0081844 | A1 | 3/2009 | Yamazaki |
| 2010/0304550 | A1 | 12/2010 | Moriwaka |
| 2011/0049087 | A1* | 3/2011 | Ferguson ........................ 216/13 |

FOREIGN PATENT DOCUMENTS

| | | |
|---|---|---|
| JP | 2005-45005 | 2/2005 |
| KR | 10-2009-0079015 | 7/2009 |
| KR | 10-2012-0042067 | 5/2012 |

* cited by examiner

*Primary Examiner* — Lee D Wilson
*Assistant Examiner* — Nirvana Deonauth
(74) *Attorney, Agent, or Firm* — Robert E. Bushnell, Esq.

(57) ABSTRACT

A donor film tray that supplies a donor film includes: a tray main body disposed in correspondence with an edge of the donor film, and including an opening that exposes a center area of the donor film; and a clamp disposed in an area of the tray main body for clamping the edge of the donor film, and for pulling the edge of the donor film in a direction away from the tray main body using the repulsive force of a magnet.

9 Claims, 7 Drawing Sheets

TRAY FOR DONOR FILM

CLAIM OF PRIORITY

This application makes reference to, incorporates the same herein, and claims all benefits accruing under 35 U.S.C. §119 from an application earlier filed in the Korean Intellectual Property Office on the 14th of Mar. 2012 and there duly assigned Serial No. 10-2012-0026135.

BACKGROUND OF THE INVENTION

1. Field of the Invention

The present invention relates generally to a donor film tray. More particularly, the invention relates to a donor film tray supporting a donor film used in a thermal transferring method for forming an organic layer of an organic light emitting diode (OLED) display.

2. Description of the Related Art

An organic light emitting element is a flat display device. Such an organic light emitting element may include an anode, a cathode, and at least an organic emission layer interleaved between the anode and the cathode. The organic light emitting element has the advantages of a wide viewing angle and a superior contracts, as well as a fast response speed. Due to the advantages of the organic light emitting element, the organic light emitting element has been receiving attention as the next generation display element.

The organic light emitting element may further include at least one organic layer interleaved among a hole injection layer (HIL), a hole transport layer (HTL), and an electron injection layer (EIL) according to whether an emission layer is made of a high molecular organic material or a low molecular organic material in addition to an organic emission layer.

In such an organic light emitting element, an organic layer is required to be patterned in order to realize full color. A low molecular organic light emitting element may be patterned using a shadow mask, and a high molecular organic light emitting element may be patterned through an ink-jet printing method and a laser induced thermal imaging (LITI) method using laser. The LITI method has advantages. For example, the LITI method can pattern a large area of an organic layer. Furthermore, the LITI method can pattern an organic layer with high precision and with high resolution.

When the organic layer is patterned using the LITL method, a donor film tray that supports a donor film where the organic layer is formed is used to handle the donor film with ease.

The above information disclosed in this Background section is only for enhancement of an understanding of the background of the described technology, and therefore it may contain information that does not form the prior art already known in this country to a person of ordinary skill in the art.

SUMMARY OF THE INVENTION

The present invention has been developed in an effort to provide a donor film tray that supports a donor film used with ease in a laser induced thermal imaging process.

One aspect of the present invention provides a donor film tray that supplies a donor film. The donor film tray includes: a tray main body disposed in correspondence with an edge of the donor film, and including an opening that exposes a center area of the donor film; and a clamp disposed in an area of the tray main body so as to clamp the edge of the donor film, and pulling the edge of the donor film in a direction away from the tray main body using the repulsive force of a magnet.

The clamp is provided in plural, and the plurality of clamps may be disposed opposite each other, with an opening interposed therebetween.

The tray main body further includes a first magnet facing the clamp, and the clamp may further include a second magnet facing the first magnet, with a repulsive magnetic force being generated between the first magnet and the second magnet.

The clamp includes a pair of first tongs having the second magnet provided therein and rotatable in a direction of the tray main body, and a pair of second tongs rotatable in a direction of the pair of first tongs and clamping the edge of the donor film together with the pair of first tongs.

The pair of second tongs may be rotatable in a direction of the pair of first tongs by an elastic restoring force.

The clamp may further include a spring provided in a rotation shaft of the pair of second tongs and generating the elastic restoring force.

The pair of second tongs may be rotatable in a direction of the pair of first tongs by magnetic attraction.

The clamp may further include a third magnet provided in the pair of second tongs corresponding to the pair of first tongs, and a magnetic attraction may be generated between the third magnet and the pair of first tongs, and between the third magnet and the second magnet.

The tray main body may further include a receiving portion recessed so as to receive the clamp.

The tray main body may further include an exposing hole that penetrates the receiving portion and exposes a part of the clamp.

According to one exemplary embodiment, a donor film tray that can support a donor film used with ease in a laser induced thermal imaging process can be provided.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

The present invention will be described more fully hereinafter with reference to the accompanying drawings, in which exemplary embodiments of the invention are shown. As those skilled in the art will realize, the described embodiments may be modified in various different ways, all without departing from the spirit or scope of the present invention.

In order to clarify the present invention, parts that are not connected with the description will be omitted, and the same elements or equivalents are referred to with the same reference numerals throughout the specification.

In several embodiments, the same reference numerals are used for elements having the same configuration to representatively explain the elements in a first embodiment, and only a different configuration from that of the first embodiment will be described in other embodiments.

The size and thickness of each element are arbitrarily shown in the drawings, and the present invention is not necessarily limited thereto.

In the drawings, the thickness of layers, films, panels, regions, etc. are exaggerated for clarity and for the sake of convenience in describing the drawings.

In addition, unless explicitly described to the contrary, the word "comprise" and variations such as "comprises" or "comprising" will be understood to imply the inclusion of stated elements but not the exclusion of any other elements.

Hereinafter, a donor film tray according to a first exemplary embodiment will be described with reference to FIG. 1 to FIG. 3.

Figure 1:
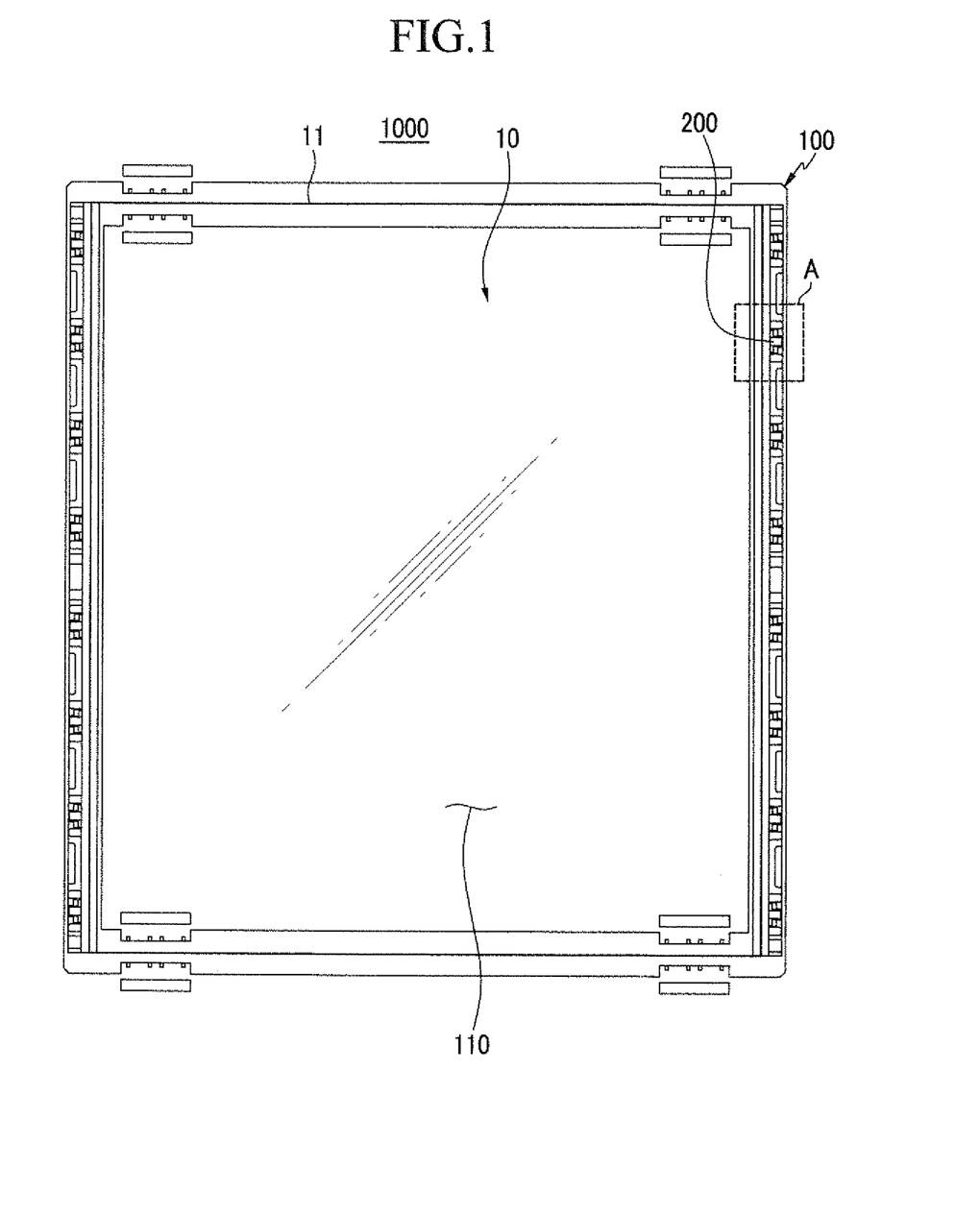
FIG. 1 is a top plan view of a donor film tray according to a first exemplary embodiment of the invention.

FIG. 1 is a top plan view of a donor film tray according to the first exemplary embodiment of the invention.

As shown in FIG. 1, a donor film tray 1000 according to the first exemplary embodiment includes a donor film 10 used in a laser induced thermal imaging (LITI) process, a tray main body 100 supporting the donor film 10 for convenience in handling of the donor film 10, and a clamp 200.

The tray main body 100 is disposed in correspondence with an edge 11 of the donor film 10 where an organic layer, including an organic emission layer, is formed. The tray main body 100 includes an opening 110 exposing a center portion of the donor film 10 and supports the edge 11 of the donor film 10.

Figure 2:
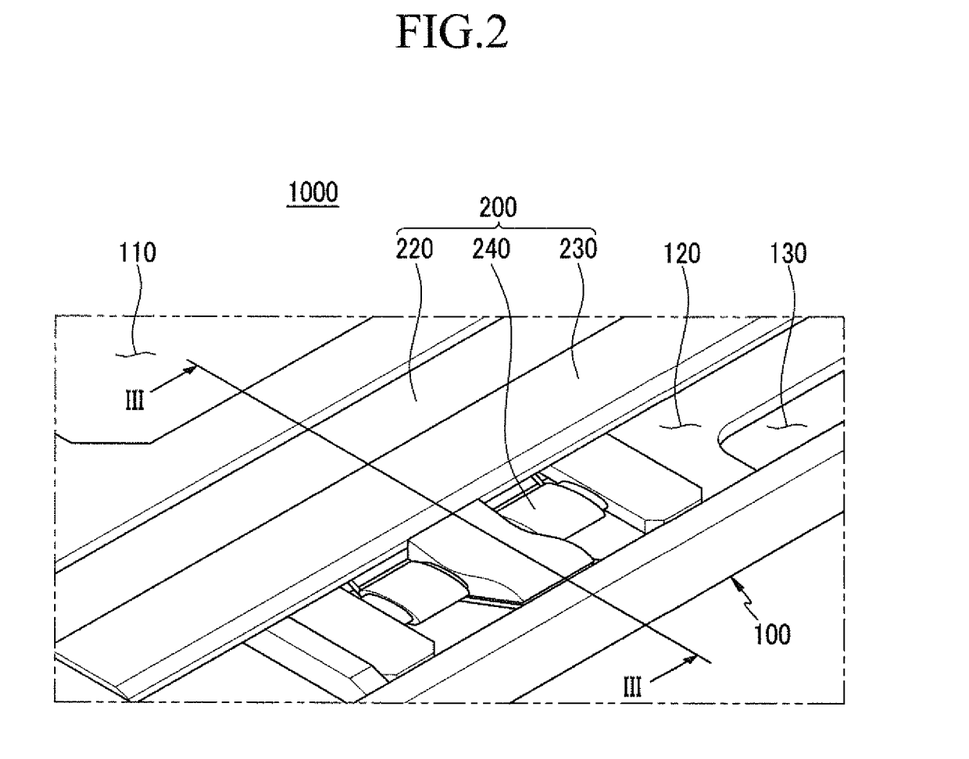
FIG. 2 is a partial perspective view of a portion A of FIG. 1.
Figure 3:
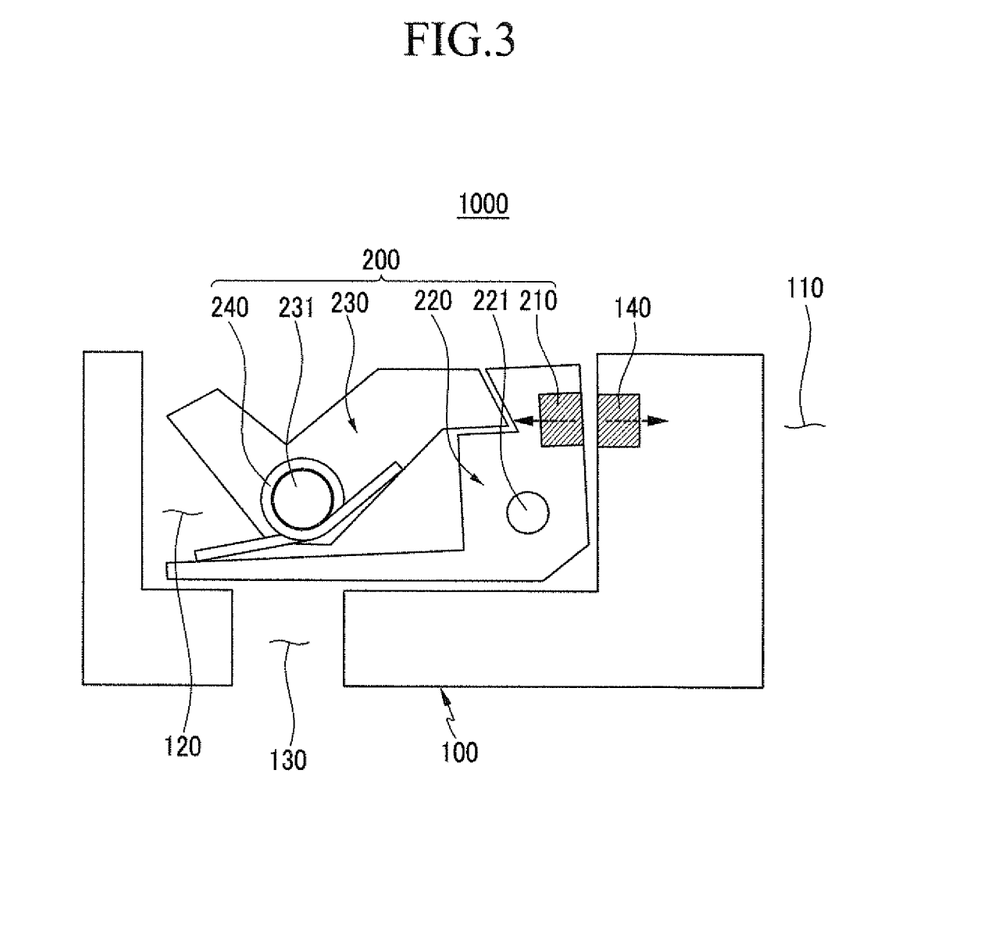
FIG. 3 is a cross-sectional view, taken along the line III-III of FIG. 2.

FIG. 2 is a partial perspective view of a portion A of FIG. 1, and FIG. 3 is a cross-sectional view, taken along the line III-III of FIG. 2. FIG. 2 and FIG. 3 do not illustrate the donor film 10 shown in FIG. 1.

As shown in FIG. 2 and FIG. 3, the tray main body 100 further includes a receiving portion 120, an exposing hole 130, and a first magnet 140.

The receiving portion 120 is recessed from one side of the tray main body 100 that supports the donor film 10 of FIG. 1 so as to receive the clamp 200. A press bar descends from an upper side of the receiving portion 120 such that clamping and unclamping of the clamp 200 are performed.

An exposing hole 130 penetrates the receiving portion 120 so as to expose a part of the clamp 200, that is, a pair of first tongs 220. A press bar (not shown) ascends through the exposing hole 130 such that clamping and unclamping of the clamp 200 are performed.

The first magnet 140 is disposed facing the clamp 200, and has the same polarity as a second magnet 210 of the clamp 200. Since the first magnet 140 of the tray main body 100 and the second magnet 210 of the clamp 200 have the same polarity, a repulsive force is generated between the tray main body 100 and the clamp 200.

The clamp 200 is disposed in the receiving portion 120 which is a part of the tray main body 100, and clamps the edge 11 (see FIG. 1) of the donor film 10. The clamp 200 pulls the edge 11 of the donor film 10 in a direction away from the tray main body 100 using the repulsive force of the magnets. The clamp 200 is provided in plural, and the plurality of clamps 200 are respectively disposed opposite each other with the opening 110 interposed therebetween.

Each of the clamps 200 includes the second magnet 210, the pair of first tongs 220, a pair of second tongs 230, and a spring 240.

The second magnet 210 is provided in the pair of first tongs 220, and faces the first magnet 140 of the tray main body 100. The second magnet 210 has the same polarity as the first magnet 140. Since the second magnet 210 provided in the pair of first tongs 210 of the clamp 200 and the first magnet 140 of the tray main body 100 have the same polarity, a repulsive force of the magnets is generated between the pair of first tongs 220 and the tray main body 100.

The pair of first tongs 220 is rotatably provided in the direction of the tray main body 100, centering a first rotating shaft 221, and rotates in a direction away from the tray main body 100 in such a state that no external force is generated due to the repulsive force of the magnets, generated between the second magnet 210 provided in the pair of first tongs 220 and the first magnet 140 provided in the tray main body 100. When the press bar ascends through the exposing hole 130, the pair of first tongs 220 rotates in a direction toward the tray main body 100 from a direction far from the tray main body 110, centered on the first rotating shaft 221.

The pair of second tongs 230 is rotatably provided in the direction of the pair of first tongs 220, centered on a second rotating shaft 231 that is distanced from the first rotating shaft 221, and rotates in the direction of the pair of first tongs 220 in such a state that no external force is generated due to an elastic restoring force generated by the spring 240. When the press bar descends from the upper portion of the receiving portion 120, the pair of second tongs 230 rotates in a direction away from the pair of first tongs 220, centered on the second rotating shaft 231. In addition, the pair of second tongs 230 clamps the edge 11 of the donor film 10 together with the pair of first tongs 220, and when the press bar ascends through the exposing hole 130, the pair of second tongs 230 rotates, together with the pair of first tongs 220, in the direction of the tray main body 100 from a direction away from the tray main body 100, centered on the second rotation shaft 231.

The spring 240 is provided in the second rotation shaft 231 of the pair of second tongs 230, and generates an elastic restoring force on the pair of second tongs 230. The spring 240 may be a coil spring or a plate spring.

Hereinafter, a clamping operation of the clamp of the donor film tray according to the first exemplary embodiment will be described with reference to FIG. 4.

FIGS. 4A-4F are provided to describe a clamping operation of a clamp of the donor film tray according to the first exemplary embodiment of the invention.

Figure 4A:
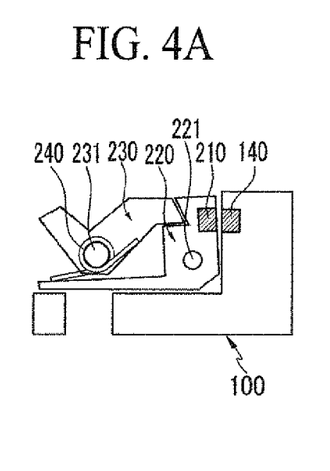
FIGS. 4A-4F are provided to describe a clamping operation of a clamp of the donor film tray according to the first exemplary embodiment of the invention.

As shown in FIG. 4A, in a state in which no external force is generated, the pair of first tongs 220 rotates in a direction away from the tray main body 100 together with the pair of second tongs 230 while the pair of second tongs 230 rotates in the direction of the pair of first tongs 220 due to the repulsive magnetic force between the first magnet 140 and the second magnet 210 and the elastic restoring force of the spring 240.

Figure 4B:
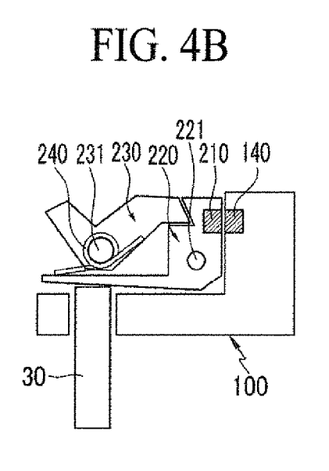

Next, as shown in FIG. 4B, when the first press bar 30 ascends through the exposing hole 130 from an external device, the pair of first tongs 220 rotates in the direction of the tray main body 100 from a direction away from the tray main body 100, centered on the first rotation shaft 221, together with the pair of second tongs 230.

Figure 4C:
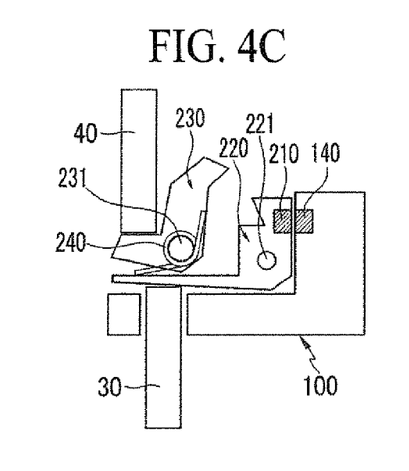

Then, as shown in FIG. 4C, when the second press bar 40 descends at an upper side of the receiving portion 120 from an external device while the first press bar 30 is in the ascended state, the pair of second tongs 230 rotate in a direction away from the pair of first tongs 220, centered on the second rotation shaft 231, such that the pair of second tongs 230 is separated from the pair of first tongs 220.

Figure 4D:
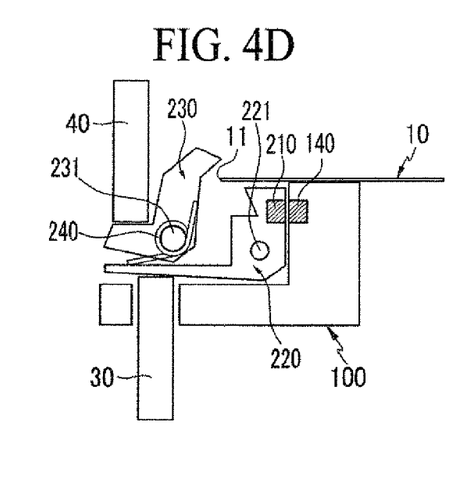

Next, as shown in FIG. 4D, the pair of second tongs 230 rotates in a direction away from the pair of first tongs 220, centered on the second rotation shaft 231, and thus the edge of the donor 10 is inserted between the pair of first tongs 220 and the pair of second tongs 230 while the pair of first tongs 220 and the pair of second tongs 230 are separated from each other.

Figure 4E:
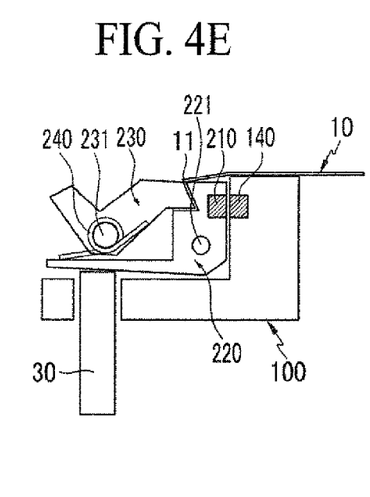

Next, as shown in FIG. 4E, when the second press bar 40 is removed, the pair of second tongs 230 rotates in the direction of the pair of first tongs 220, centered on the second rotation shaft 231, due to the elastic restoring force of the spring 240 so that the pair of second tongs 230 clamps the edge 11 of the donor film 10, together with the pair of first tongs 220.

Figure 4F:
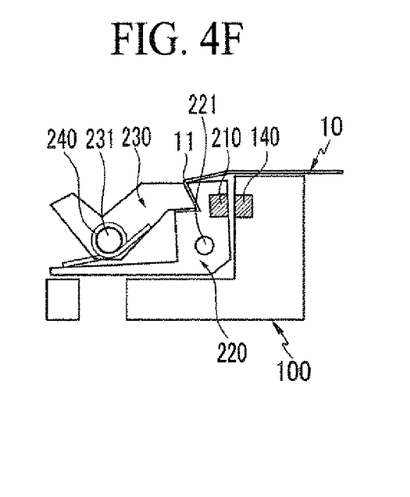
Figure 5A:
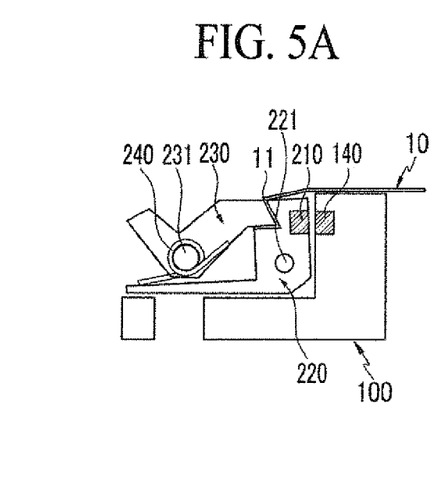
FIGS. 5A-5F are provided to describe an unclamping operation of the clamp of the donor film tray according to the first exemplary embodiment of the invention.
Figure 5B:
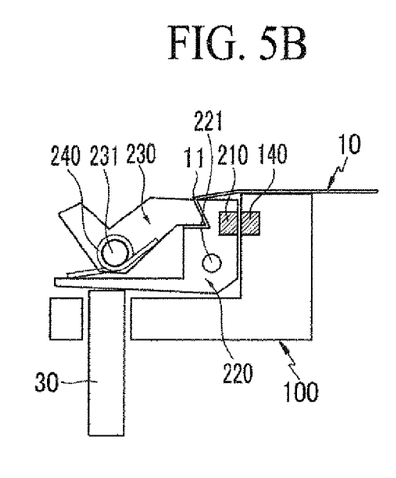
Figure 5C:
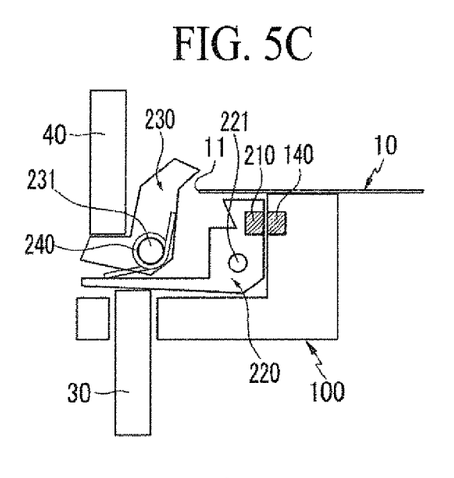
Figure 5D:
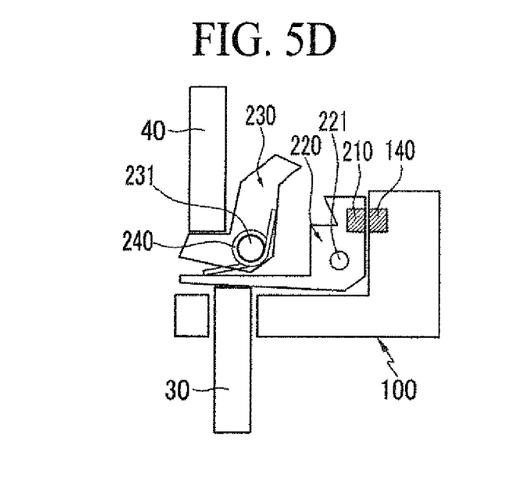
Figures 5E, 5F:
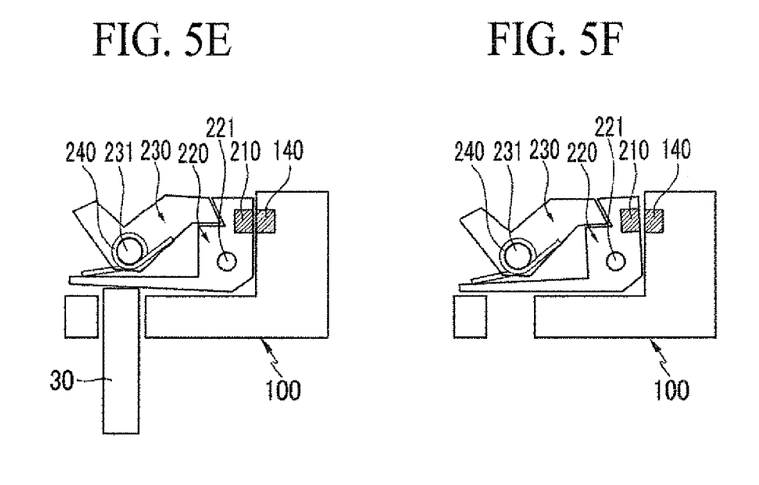

Next, as shown in FIG. 4F, when the first press bar 30 is removed, the pair of first tongs 220 rotates in a direction away from the tray main body 100, together with the pair of second tongs 230, due to a repulsive force generated between the first magnet 140 and the second magnet 210, while the pair of second tongs 230 are rotated in the direction of the pair of first tongs 220 so that the clamp 200 pulls the edge 11 of the donor film 10 in a direction away from the tray main body 100, and thus tension is generated in the donor film 10 supported by the tray main body 100. Accordingly, no sagging occurs in the center area of the clamped donor film 10.

Hereinafter, an unclamping operation of the clamp of the donor film tray according to the first exemplary embodiment will be described with reference to FIGS. 5A-5F.

FIGS. 5A-5F are provided to describe an unclamping operation of the clamp of the donor film tray according to the first exemplary embodiment of the invention.

As shown in FIGS. 5A-5F, the unclamping operation of the clamp 200 of the donor film tray 1000 is performed by performing the clamping operation of the clamp 200 in a reverse order. Such an unclamping operation may be performed after laser induced thermal imaging (LITI) is finished using the donor film 10.

As described, in the donor film tray 1000 according to the first exemplary embodiment, the clamp 200 pulls the edge 11 of the donor film 10 in a direction away from the tray main body 100 using a repulsive force of the magnet when the donor film 10 is clamped using the clamp 200, and therefore tension occurs in the donor film 10, and thus sagging of the center area of the donor film 10 can be prevented. This also suppresses occurrence of a failure in the LITI process performed using the donor film 10.

In addition, in the donor film tray 1000 according to the first exemplary embodiment, the clamp 200 pulls the edge 11 of the donor film 10 using the repulsive force of the magnet, and thus the donor film 10 does not experience any change in the tension force generated therein even though the donor film tray 1000 is used for a long period of time. Accordingly, quality of the donor film tray 1000 can be consistent even though the tray is used in the LITI process for a long period of time. That is, reliability in use of the donor film tray 1000 can be improved.

In addition, since the clamp 200 pulls the edge 11 of the donor film 10 using a magnetic repulsive force, the donor film tray 1000 can be prevented from experiencing mechanical fatigue by the clamp 200, and accordingly life-span of the donor film tray 1000 according to the first exemplary embodiment can be improved. This also can reduce manufacturing time and manufacturing cost of the organic light emitting diode display using the LITI process.

Hereinafter, a donor film tray according to a second exemplary embodiment will be described with reference to FIG. 6 and FIG. 7.

Only characteristics parts different from the first embodiment will be described, and the description of parts common with the first embodiment is omitted. In explaining the second embodiment, the same reference numerals as those in the first embodiment are used for the same elements for the sake of explanation.

Figure 6:
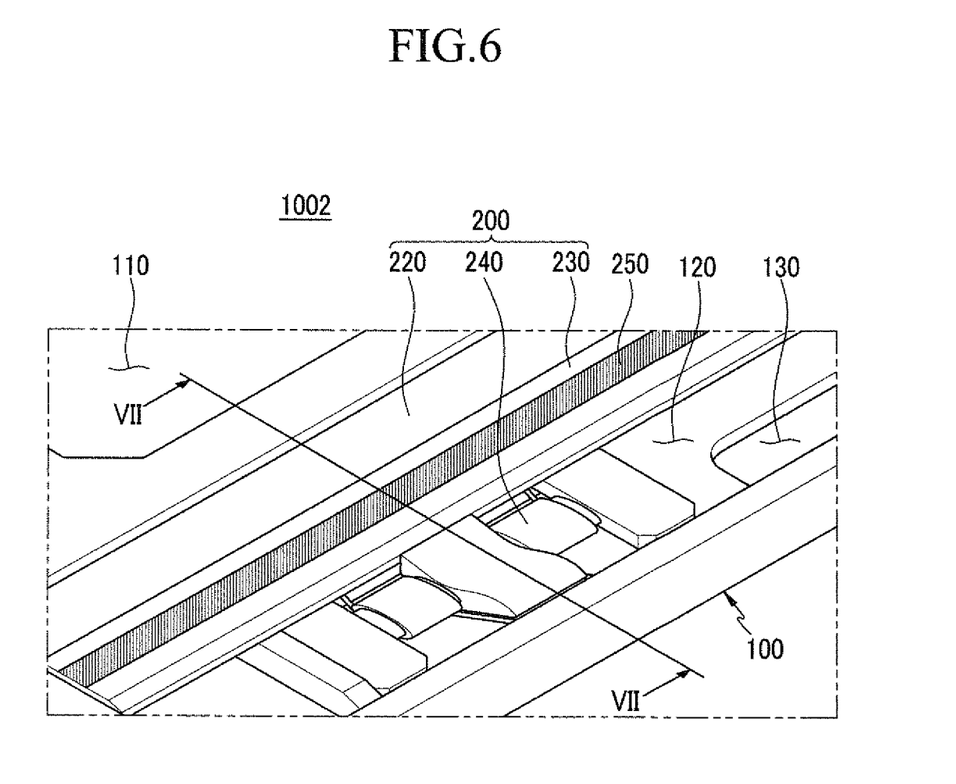
FIG. 6 is a partial perspective film of a donor film tray according to a second exemplary embodiment of the invention.
Figure 7:
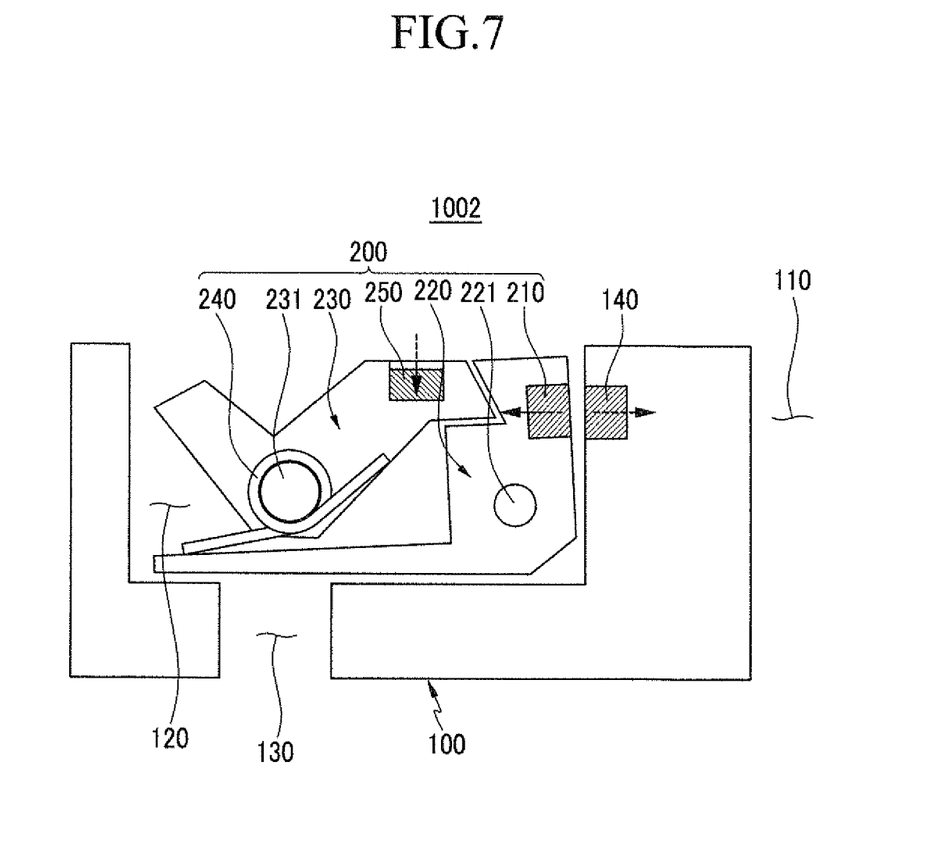
FIG. 7 is a cross-sectional view, taken along the line VII-VII of FIG. 6.

FIG. 6 is a partial perspective view of a donor film tray according to a second exemplary embodiment, and FIG. 7 is a cross-sectional view, taken along the line VII-VII of FIG. 6.

As shown in FIG. 6 and FIG. 7, a donor film tray 1002 according to the second exemplary embodiment includes a tray main body 100 and a clamp 200.

The clamp 200 includes a second magnet 210, a pair of first tongs 220, a pair of second tongs 230, a spring 240, and a third magnet 250.

The third magnet 250 is provided in the pair of second tongs 230 in correspondence with the pair of first tongs 220, and corresponds to the second magnet 210 provided in the pair of first tongs 220. Since the third magnet 250 is provided in the pair of second tongs 230, the pair of second tongs 220 rotates in the direction of the pair of first tongs 220 due to an elastic restoring force of the spring 230 and magnetic attraction generated between the third magnet 250 and the pair of first tongs 220, and between the third magnet 250 and the second magnet 210, unless an external force is applied.

As described, in the donor film tray 1002 according to the second exemplary embodiment, when the donor film 10 is clamped using the clamp 200, the pair of second tongs 230 clamps an edge 11 of the donor film 10 together with the pair of first tongs 220 due to the elastic restoring force of the spring 240 and the magnetic attraction generated between the third magnet 250 and the pair of first tongs 220, and between the third magnet 250 and the second magnet 210, so that the spring 240 and the pair of second tongs 230 do not experience mechanical fatigue. Thus, the clamp 200 can be prevented from experiencing mechanical fatigue, and accordingly the life-span of the donor film tray 1002 can be improved. This also can reduce manufacturing time and manufacturing cost of the organic light emitting diode display using the LITI process.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A donor film tray supporting a donor film, comprising:
a tray main body on which the donor film is disposed, the tray main body including an opening which exposes a center area of the donor film; and
a clamp installed on the tray main body for clamping an edge of the donor film, the tray main body including a first magnet facing the clamp, the clamp including a second magnet facing a surface of the first magnet, the surface of the first ma net and a surface of the second magnet facing the surface of the first magnet having the same magnetic polarity to produce a repulsive force between the first magnet and the second magnet.

2. The donor film tray of claim 1, further comprising another clamp installed on the tray main body for clamping another edge of the donor film, said another clamp disposed to face the clamp, the opening of the tray main body disposed between the clamp and said another clamp.

3. The donor film tray of claim 1, wherein the clamp further comprises:
   a pair of first tongs on which the second magnet is installed, the pair of the first tongs being rotatable to move the second magnet toward or away from the first magnet; and
   a pair of second tongs rotatable in a direction of the pair of first tongs, said pair of the second tongs engaging with the pair of the first tongs to clamp the edge of the donor film.

4. The donor film tray of claim 3, wherein the pair of the second tongs is rotatably disposed, and is driven by an elastic restoring force.

5. The donor film tray of claim 4, wherein the clamp further comprises a spring provided in a rotation shaft of the pair of the second tongs, the spring generating the elastic restoring force.

6. The donor film tray of claim 3, wherein the pair of the second tongs is rotatably disposed, and is driven by magnetic attraction.

7. The donor film tray of claim 6, wherein the clamp further comprises a third magnet provided in the pair of the second tongs, a surface of the third magnet facing the second magnet and another surface of the second magnet facing the third magnet having opposite magnetic polarities to produce the magnetic attraction between the second magnet and the third magnet.

8. The donor film tray of claim 1, wherein the tray main body further comprises a receiving portion recessed from a surface of the tray main body to accommodate the clamp.

9. The donor film tray of claim 8, wherein the tray main body further comprises an exposing hole penetrating the tray main body to expose a portion of the receiving portion, a portion of the clamp being exposed through the exposing hole.

* * * * *